(12) United States Patent  (10) Patent No.: US 9,172,364 B2
Trampitsch  (45) Date of Patent: Oct. 27, 2015

(54) ISOLATED BOOTSTRAPPED SWITCH

(71) Applicant: Linear Technology Corporation, Milpitas, CA (US)

(72) Inventor: Gerd Trampitsch, Unterfoehring (DE)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/157,300

(22) Filed: Jan. 16, 2014

(65) Prior Publication Data

US 2015/0109161 A1  Apr. 23, 2015

Related U.S. Application Data

(60) Provisional application No. 61/894,764, filed on Oct. 23, 2013.

(51) Int. Cl.
  H03M 1/12  (2006.01)
  H03K 17/06  (2006.01)
  H03K 17/16  (2006.01)
  H03K 3/356  (2006.01)

(52) U.S. Cl.
  CPC ........ *H03K 17/063* (2013.01); *H03K 3/356034* (2013.01); *H03K 17/165* (2013.01); *H03M 1/124* (2013.01); *H03M 1/129* (2013.01); *H03K 2217/0009* (2013.01); *H03K 2217/0054* (2013.01)

(58) Field of Classification Search
  CPC ...... H03M 1/129; H03K 1/165; H03K 17/063
  USPC .................................. 341/172, 155; 327/536
  See application file for complete search history.

(56) References Cited

U.S. PATENT DOCUMENTS

| 3,737,893 | A |   | 6/1973  | Belet et al. |
| 4,633,106 | A | * | 12/1986 | Backes et al. ................. 327/536 |
| 5,184,128 | A |   | 2/1993  | Snow |
| 5,455,794 | A | * | 10/1995 | Javanifard et al. ....... 365/185.18 |
| 5,831,562 | A |   | 11/1998 | Van Auken et al. |
| 5,841,703 | A | * | 11/1998 | Wojciechowski ........ 365/189.09 |

(Continued)

FOREIGN PATENT DOCUMENTS

EP  2533248 A2  12/2012

OTHER PUBLICATIONS

International Search Report for European Patent Application 14158410.2-1805, dated Jul. 4, 2014, 8 pages.

(Continued)

*Primary Examiner* — Jean B Jeanglaude
(74) *Attorney, Agent, or Firm* — Edward C. Kwok; Hogan Lovells US LLP

(57) ABSTRACT

A bootstrapped switch circuit capable of operating at input signals from far below the negative supply rail to far beyond the positive supply rail may include (a) a switch having a first terminal coupled to an input terminal, a second terminal coupled to an output terminal, and a control terminal; (b) a charge pump coupled to one or more clock signals and isolated from a timing circuit via a first capacitor and a second capacitor, the charge pump generating an output voltage; and (c) a logic circuit coupled to one or more clock signals and isolated from the timing control circuit via a third capacitor and a fourth capacitor, wherein the logic circuit provides a control signal to the control terminal of the switch that is derived from the output voltage of the charge pump.

28 Claims, 10 Drawing Sheets

(56) References Cited

U.S. PATENT DOCUMENTS

| | | |
|---|---|---|
| 6,232,907 B1 | 5/2001 | Nagaraj et al. |
| 7,176,742 B2 | 2/2007 | Aksin et al. |
| 8,022,679 B2 | 9/2011 | Sachdev et al. |
| 2002/0039301 A1* | 4/2002 | Roohparvar et al. ............ 363/60 |
| 2002/0041503 A1* | 4/2002 | Roohparvar et al. ............ 363/60 |
| 2006/0202742 A1* | 9/2006 | Aksin et al. .................... 327/536 |
| 2007/0139092 A1 | 6/2007 | Goncalves et al. |
| 2013/0009623 A1 | 1/2013 | Birk et al. |

OTHER PUBLICATIONS

Yen, Robert C. et al., "A MOS Switched-Capacitor Instrumentation Amplifier", IEEE Journal of Solid State Circuits, vol. SC-17, No. 6, Dec. 1982, pp. 1008-1013.

Extended European Search Report for Application No. 14002509.9, dated Oct. 30, 2014, 8 pgs.

* cited by examiner

ISOLATED BOOTSTRAPPED SWITCH

CROSS REFERENCE TO RELATED APPLICATIONS

The present application relates to and claims priority of U.S. provisional patent application ("Co-pending Provisional Patent Application"), Ser. No. 61/894,764, entitled "Isolated Bootstrapped Switch," filed on Oct. 23, 2013. The disclosure of the copending Provisional Patent Application is hereby incorporated by reference in its entirety.

BACKGROUND OF THE INVENTION

1. Field of the Invention

The present invention relates to an input circuit for sampling an analog signal. In particular, the present invention relates to an input circuit for sampling an analog differential signal with a wide common mode range.

2. Discussion of the Related Art

In an analog-to-digital converter (ADC), it is higher desirable to have an input circuit that allows sampling a fully differential signal. It is particularly desirable when the input circuit can sample a differential analog signal with a magnitude that is greater than a diode drop, and performs that sampling over a large common mode range.

FIG. 1 shows a switching circuit that is disclosed in U.S. Pat. No. 8,022,679 ("the '679 patent"), entitled "SYSTEMS AND METHODS FOR FAST SWITCH TURN ON APPROXIMATING IDEAL DIODE FUNCTION." As shown in FIG. 1, the switching circuit of the '679 patent is not fully capacitively isolated, and its charge pump is not referenced to a source terminal of the switch. Also, the switching circuit has neither a discriminator nor a voltage regulator to provide a well-controlled gate-to-source voltage ($V_{GS}$). Therefore, the switching circuit of the '679 patent cannot operate below the ground reference and thus is not suitable for use in a sampling network for an ADC.

FIG. 2 shows a bootstrapped switch circuit disclosed in U.S. Pat. No. 7,176,742 ("the '742 patent"), entitled "BOOTSTRAPPED SWITCH WITH AN INPUT DYNAMIC RANGE GREATER THAN SUPPLY VOLTAGE." The bootstrapped switch circuit of the '742 patent may be used for sampling an input signal that goes beyond the power supply voltages. However, this bootstrapped switch circuit is capable of accepting an input signal that exceeds the supply voltage on the positive side by a limited amount, as the several low voltage transistors in the bootstrapping circuit is unable to withstand higher voltage signals. As shown in FIG. 2, the bootstrapped switch circuit of the '742 patent includes capacitor C13 that is precharged by being first connected between supply voltages GND and VDD. The charged capacitor is then switched to being connected between the source and gate terminals of bootstrapped switch N20. For high input signals, precharged capacitor C13 must swing up to the input signal. The parasitic capacitors in bootstrapped switch MMN20 result in a signal-dependent $V_{GS}$.

FIG. 3 shows a bipolar switch that is disclosed in U.S. Patent Application Publication 2013/009623 ("the '623 publication"), entitled "FOUR-QUADRANT BOOTSTRAPPED SWITCH CIRCUIT." The bipolar switch in the '623 publication is operated by a floating voltage source. The switch of the '623 publication cannot accept an input signal that can go beyond the supply voltages, as the floating voltage source is generated by current sources that operate between those supply voltages.

SUMMARY

According to one embodiment of the present invention, a bootstrapped switch circuit includes a capacitor that is charged by a charge pump and which is coupled to a source terminal of a bootstrapped switch. A potential difference across the capacitor operates a logic circuit that controls other switches which charge or discharge the gate-to-source capacitance of the bootstrapped switch. The logic circuit is fully capacitively isolated. In one implementation, the logic circuit includes a latch structure which detects whether or not the bootstrapped switch should be turned on or turned off. The logic circuit may include a voltage regulator that provides a constant gate-to-source voltage ($V_{GS}$). A constant $V_{GS}$ provides a constant switch resistance.

According to one embodiment of the present invention, a bootstrapped switch circuit is coupled to a timing circuit that provides one or more clock signals, and has an input terminal and an output terminal. The bootstrapped switch circuit may include (a) a switch having a first terminal coupled to the input terminal, a second terminal coupled to the output terminal, and a control terminal; (b) a charge pump coupled to the clock signals and isolated from the timing circuit via a first capacitor and a second capacitor, the charge pump generating an output voltage; and (c) a logic circuit coupled to the clock signals and isolated from the timing control circuit via a third capacitor and a fourth capacitor, wherein the logic circuit provides a control signal to the control terminal of the switch that is derived from the output voltage of the charge pump. In one implementation, the switch in the bootstrapped switch circuit may be provided by either (a) a single transistor or (b) two transistors having their source terminals connected in common. The logic circuit may include a voltage regulator circuit that generates a regulated voltage from the output voltage of the charge pump.

In one implementation, the logic circuit may include a latch structure. The charge pump, the logic circuit and the switch are implemented by NMOS transistors formed in a P-well enclosed by a N-tub region in a semiconductor substrate. The voltage on the N-tub region may be actively switched between a reference voltage and the input signal, or left floating.

In one embodiment, the clock signals comprise one or more pairs of complementary, but non-overlapping periodical waveforms.

The bootstrapped switch of the present invention may be used in numerous applications, such as (a) a power meter referenced to ground reference GND, for monitoring positive and negative supplies, (b) an input common mode extension for a high-resolution ADC, and (c) a high-speed or high-resolution ADC, and (d) monitoring fuel cells that can reverse polarity. A bootstrapped switch circuit of the present invention may operate in a wide input signal range, and allows sampling signals that are far above supply voltage VDD or far below ground reference GND. The bootstrapped switch circuit provides isolated sampling of large differential input voltages from minus $V_{DSMAX}$ to plus $V_{DSMAX}$ specified for the bootstrapped switch.

The present invention is better understood upon consideration of the detailed description below in conjunction with the accompanying drawings.

DETAILED DESCRIPTION OF THE PREFERRED EMBODIMENT

Figure 1:
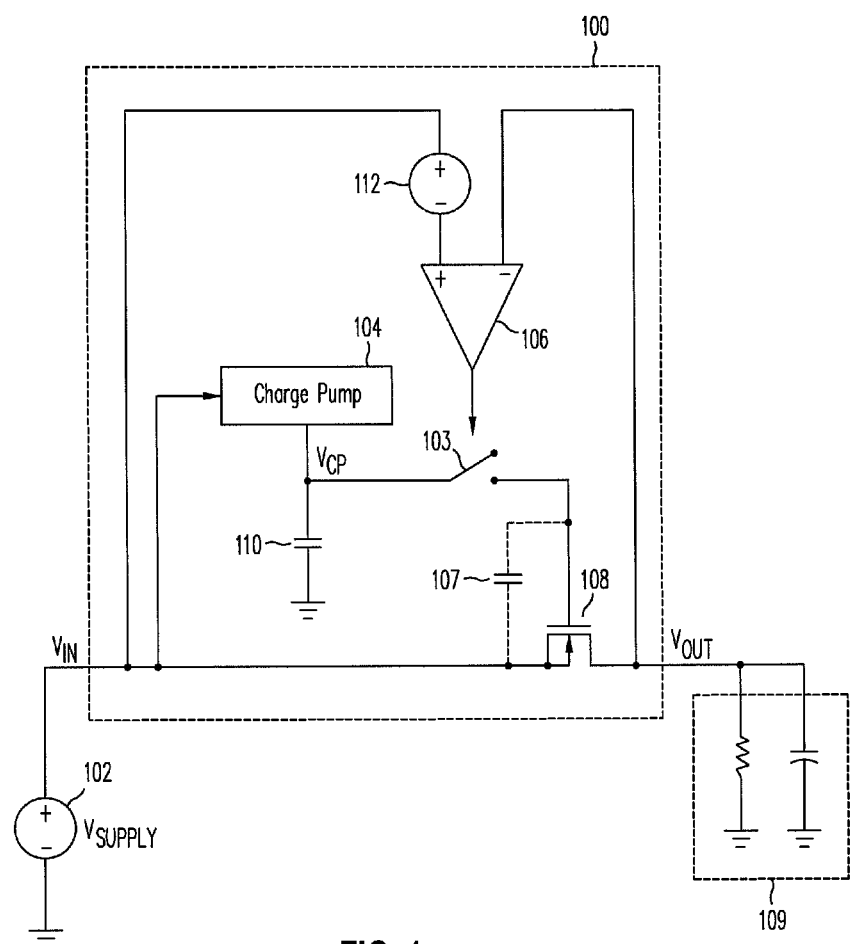
FIG. 1 shows a switching circuit in the prior art.
Figure 2:
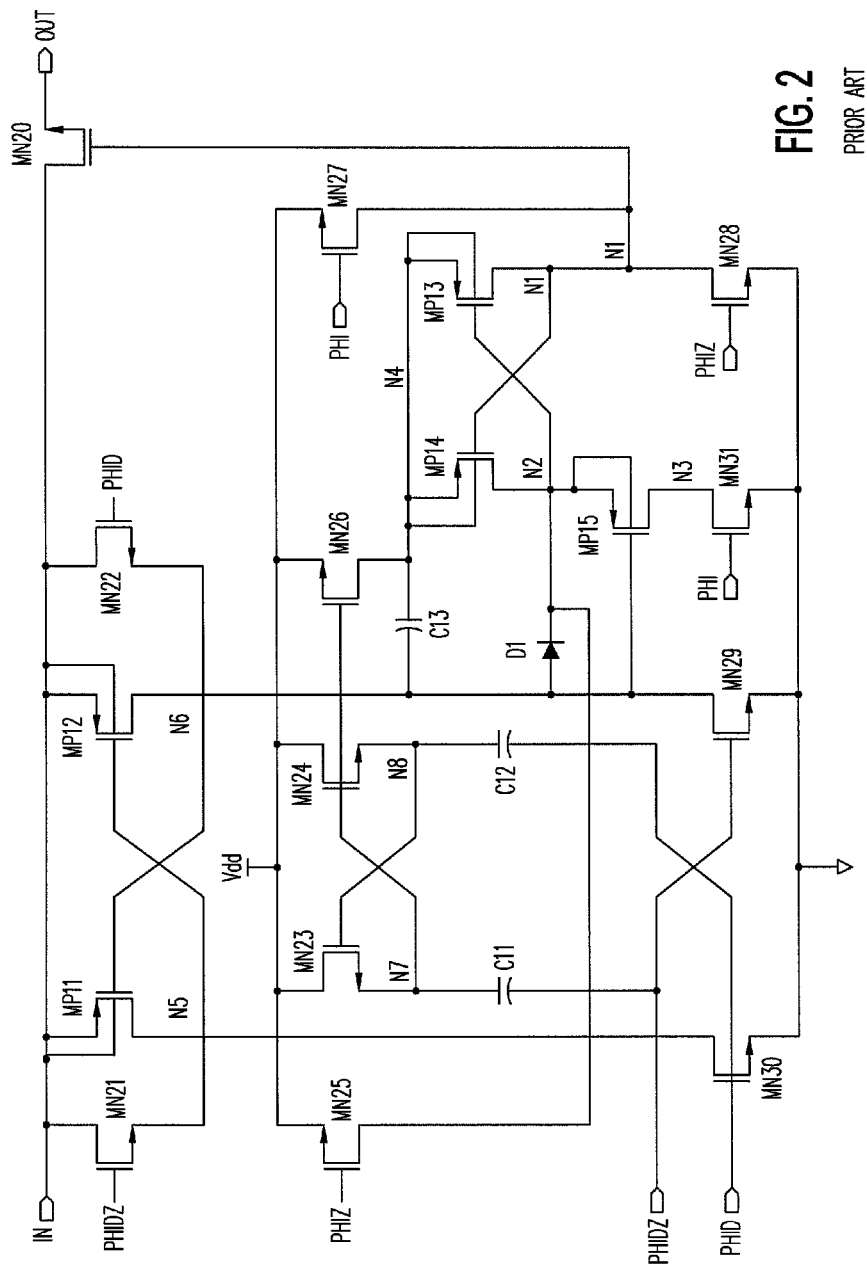
FIG. 2 shows a prior art bootstrapped switch circuit.
Figure 3:
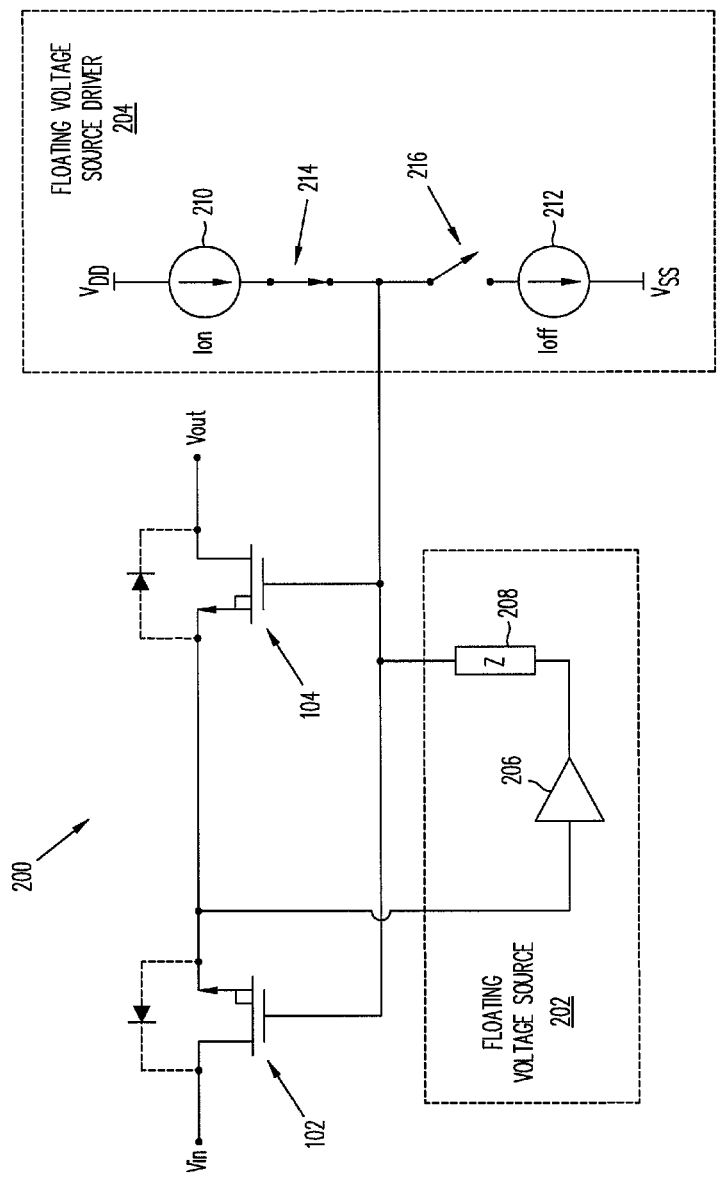
FIG. 3 shows a prior art switch that operates with a floating voltage source.
Figure 4:
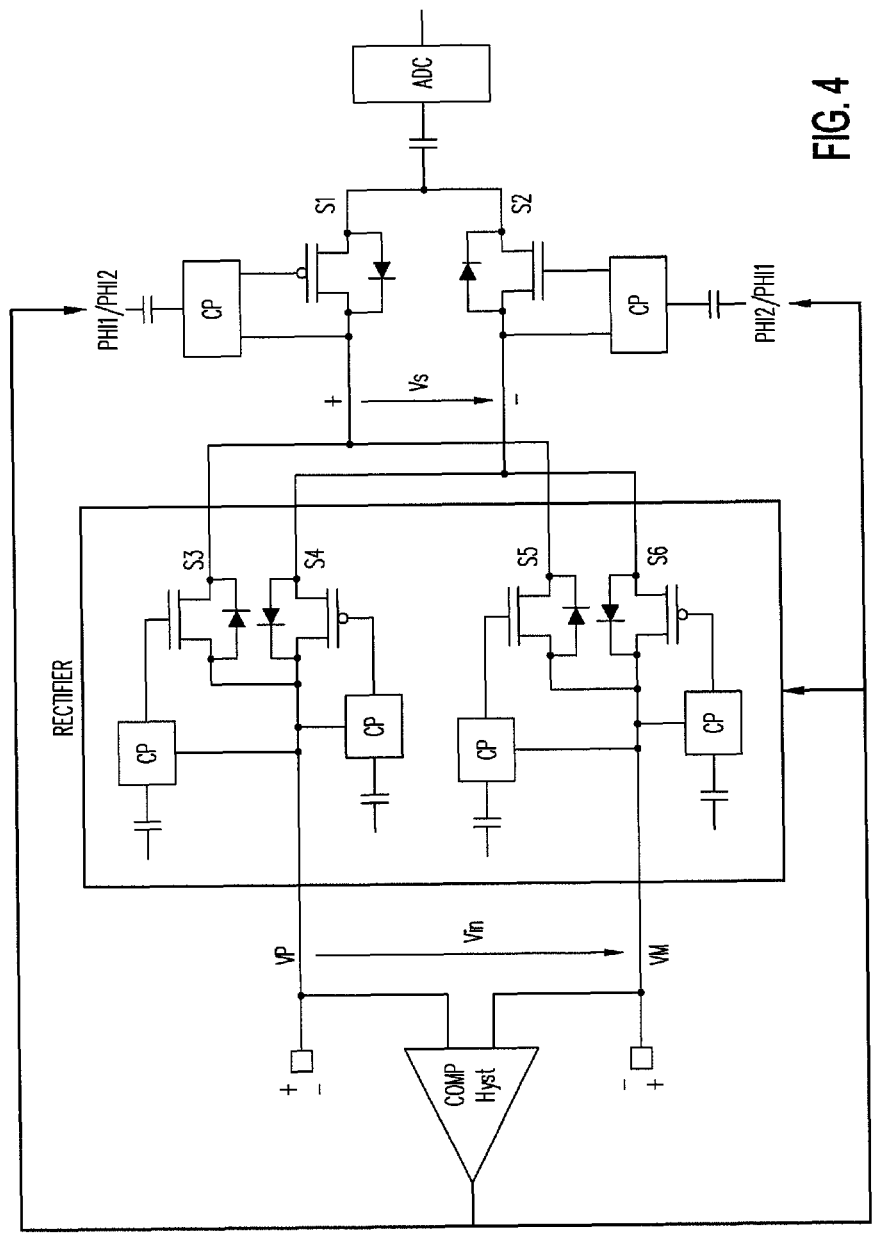
FIG. 4 shows a sampling network with switching circuits, described in a copending patent application.

FIG. 4 shows a sampling network with switching circuits that is described in the present inventor's copending U.S. patent application Ser. No. 13/841,459, now U.S. Pat. No. 8,907,703, issued Dec. 9, 2014, entitled "ISOLATED HIGH VOLTAGE SAMPLING NETWORK." The Copending Patent Application is hereby incorporated by reference in its entirety. In the Copending Patent Application, the sampling network uses ground-referenced charge pumps, and thus the switches in the sampling network are unable to establish a constant $V_{GS}$ for a rapidly changing input signal. Also, PMOS transistors with their N-Wells connected to the input signal render the switches unable to operate below substrate potential because the open circuit in the diode to the p-substrate. The signal polarity comparator in FIG. 4 is required to operate beyond the supply voltages.

Figures 5A, 5B:
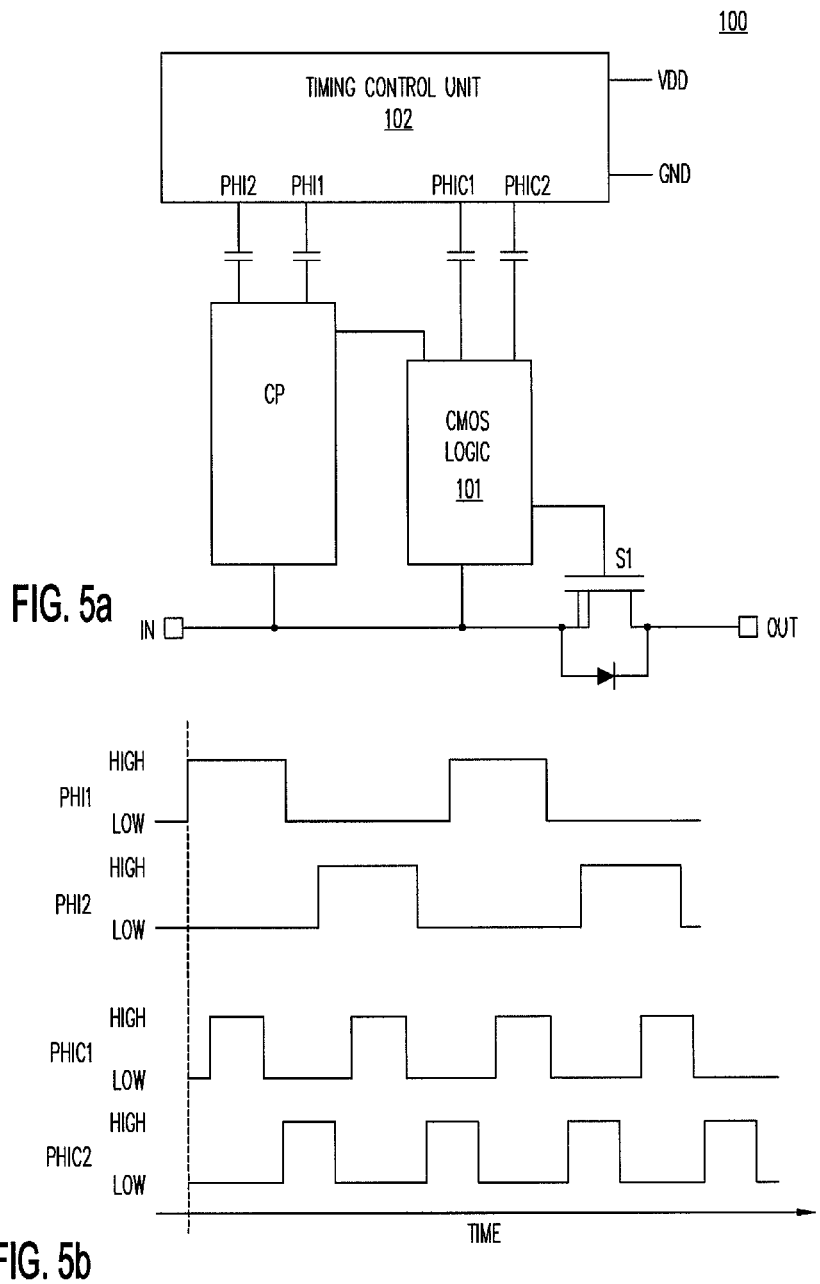
FIG. 5(a) is block diagram 100 of a bootstrapped switch circuit, showing source terminal OUT of bootstrapped switch S1 being connected to charge pump CP, in accordance with one embodiment of the present invention.
FIG. 5(b) shows the waveforms of clock signals PHI1 PHI2, PHIC1 and PHIC2, according to one embodiment of the present invention.

FIG. 5(a) is block diagram 100 of a bootstrapped switch circuit, showing source terminal OUT of bootstrapped switch S1 being connected to charge pump CP, in accordance with one embodiment of the present invention. As shown in FIG. 5(a), charge pump CP generates a voltage difference to supply the operation of CMOS logic circuit 101. In turn, CMOS logic circuit 101 controls the gate-to-source voltage ($V_{GS}$) of bootstrapped switch S1, which switches bootstrapped switch S1 between conducting and non-conducting states. Bootstrapped switch S1, when in the conducting state, passes the input signal at drain terminal IN to source terminal OUT. Charge pump CP and CMOS logic circuit 101 are controlled by clock signals PHI1 PHI2, PHIC1 and PHIC2, respectively, which are provided by timing control unit 102 via capacitors. Other than these capacitor-coupled clock signals, bootstrapped switch S1, charge pump CP and CMOS logic circuit 101 are isolated from power supply voltages VDD and GND. Timing control unit 102 draws power from power supply voltages VDD and GND.

FIG. 5(b) shows the waveforms of clock signals PHI1 PHI2, PHIC1 and PHIC2, according to one embodiment of the present invention. As shown in FIG. 5(b), clock signals PHI1 and PHI2 are substantially complementary and non-overlapping (i.e., having a time delay between the rising or falling edge of each clock signal and the immediately following rising or falling edge of the other signal). Clock signals PHIC1 and PHIC2 are similarly complementary and non-overlapping.

Figure 6:
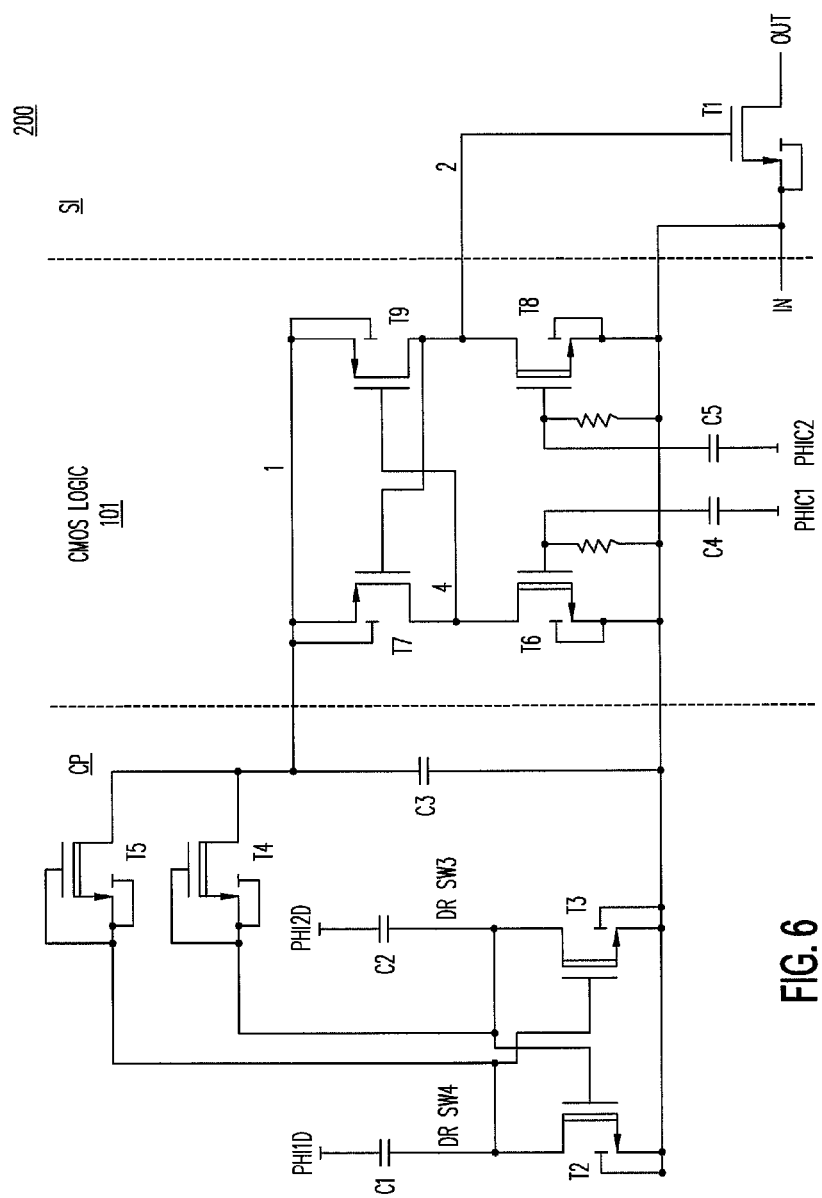
FIG. 6 is a schematic diagram showing bootstrapped switching circuit 200, which is one implementation of charge pump CP, CMOS logic circuit 101 and bootstrapped switch S1 of FIG. 5(a), in accordance with one embodiment of the present invention.

FIG. 6 is a schematic diagram showing bootstrapped switch circuit 200, which is an implementation of charge pump CP, CMOS logic circuit 101 and bootstrapped switch S1 of FIG. 5(a), in accordance with one embodiment of the present invention. As shown in FIG. 6, in bootstrapped switch circuit 200, charge pump CP includes NMOS transistors T2, T3, T4, and T5 and capacitors C1, C2 and C3. Clock signals PHI1D and PHI2D have substantially the same waveforms as clock signals PHI1 and PHI2 of FIG. 5(b), which alternately charge capacitors C1 and C2. In each clock cycle, the voltages across capacitors C2 and C1 charge capacitor C3 through diode-configured NMOS transistors T4 and T5, respectively, to generate a voltage difference between electrical node 1 and source terminal IN of bootstrapped switch S1. In bootstrapped switch circuit 200, bootstrapped switch S1 is implemented by NMOS transistor T1. CMOS logic circuit 101 is implemented by PMOS transistors T7 and T9, NMOS transistors T6 and T8, capacitors C4 and C5, and resistors that are connected cross each of the gate terminals of NMOS transistors T6 and T8 and source terminal IN of bootstrapped switch S1. CMOS logic circuit 101 is implemented as a latch structure with a stored signal that is output at electrical node 2. The stored signal is overwritten by the changing logic states of clock signals PHIC1 and PHIC2. When ground-referenced clock signal PHIC1 pushes capacitor C4 to a high voltage state (relative to source terminal IN), NMOS transistor T6 is turned on, thereby pulling electrical node 4 to the voltage at source terminal IN, and turning on PMOS transistor T9. Conducting PMOS transistor T9 brings electrical node 2 to the voltage level of electrical node 1. Alternatively, when ground-referenced clock signal PHIC2 pushes capacitor C5 to a high voltage state (relative to source terminal IN), NMOS transistor T8 is turned on, thereby pulling electrical node 2 to the voltage at source terminal IN, while turning on PMOS transistor T7 to bring electrical node 4 to the voltage level of electrode node 1 and switching off PMOS transistor T9. For an input signal at source terminal IN that is below substrate bias of PMOS transistors T7 and T9, the bulk terminals of PMOS transistors T7 and T9 cannot be connected to electrical node 1 to avoid the parasitic diodes to substrate turning on. As the maximum bulk-to-source voltage of a small low voltage PMOS transistor is low, larger (but slower) high voltage PMOS transistors may be required for operations far below the substrate bias voltage.

Figure 7A:
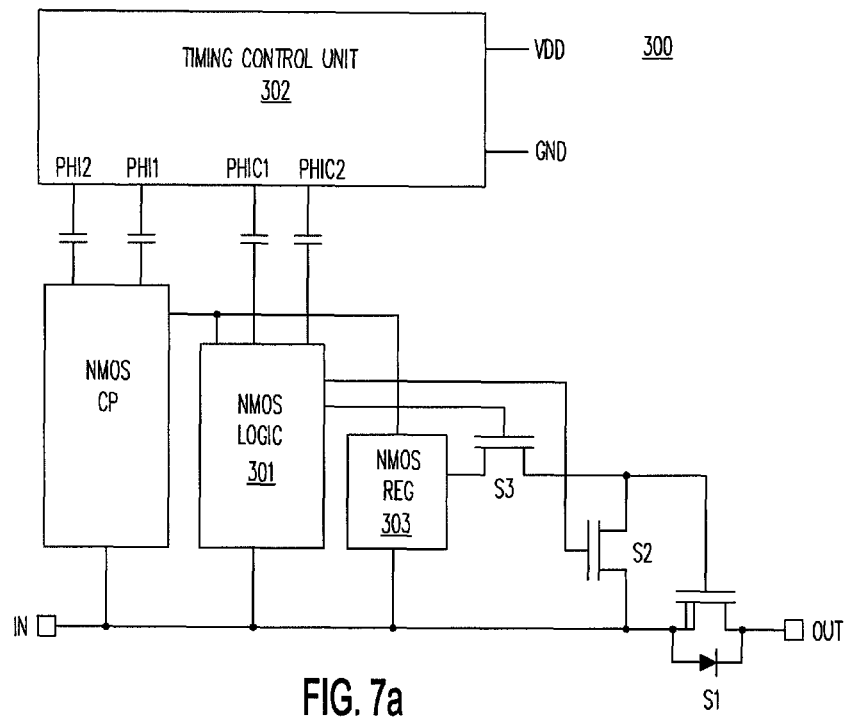
FIG. 7(a) is block diagram 300 showing an NMOS implementation of a bootstrapped switch circuit according to one embodiment of the present invention.
Figure 7B:
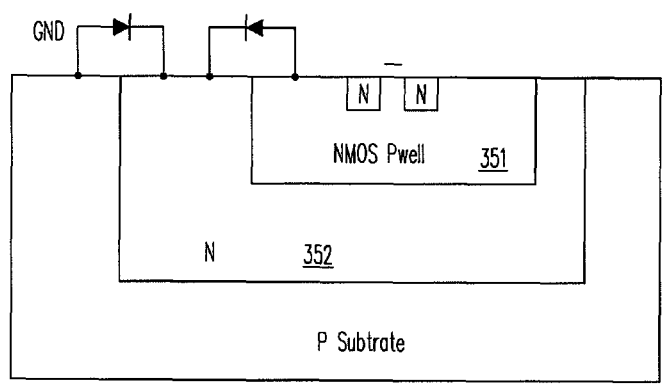
FIG. 7(b) illustrates a structure that implements NMOS transistors in an isolated voltage domain, in accordance with one embodiment of the present invention.

FIG. 7(a) is block diagram 300 showing an NMOS implementation of a bootstrapped switch circuit according to one embodiment of the present invention. Generally, a CMOS logic circuit (e.g., circuit 200 of FIG. 6) includes both PMOS and NMOS transistors which allow the CMOS logic circuit to avoid static current consumption. As shown in FIG. 7(a), block diagram 300 shows bootstrapped switch S1 controlled by NMOS logic circuit 301 through NMOS transistors S2 and S3. In this embodiment, only NMOS transistors are used in the isolated voltage domain, which includes charge pump NMOS CP, NMOS logic circuit 301, NMOS regulator circuit 303, and NMOS transistor S2 and S3. Timing control unit 302 is capacitively coupled to the isolated voltage domain through clock signals PHI1, PH12, PHIC1 and PHIC2. FIG. 7(b) illustrates a structure for implementing NMOS transistors in such an isolated voltage domain, in accordance with one embodiment of the present invention. As shown in FIG. 7(b), NMOS transistors may be formed in P-well 351, which is provided in N-tub region 352; N-tub region 352 may be biased above ground potential, if an input signal that goes below ground potential is supported. When the input signal is above ground potential, the potential in N-tub region 352 should follow the input signal. N-tub 352 may be actively biased by switching the bias voltage in N-tub region 352 between a reference voltage (e.g. power supply voltage GND) and the input signal, so as to avoid currents through the parasitic diodes. Leaving N-tub region 352 floating is also possible to avoid excessive current through the parasitic diodes.

The absence of PMOS transistors in N-tub region 352 allows the bootstrapped switch circuit of block diagram 300 to sample input signals far below ground potential and far above power supply voltage VDD. NMOS regulator circuit 303 generates a precise voltage at its output terminals (i.e., referenced to the source terminal of NMOS switch S3) by stepping down an output voltage of charge pump NMOS CP. The regulated output voltage is coupled by NMOS switch S3 to the gate terminal of bootstrapped switch S1. NMOS logic circuit 301, which is supplied by charge pump NMOS CP, may generate logic signals that exceed the output voltage of NMOS regulator circuit 303, so as to properly turn on NMOS switches S3 and S2. When NMOS switch S3 is conducting, the gate terminal of bootstrapped switch S1 is raised to an output voltage of NMOS regulator circuit 303, thereby turning on bootstrapped switch S1. NMOS switch S2 is turned on to discharge the parasitic gate-to-source capacitor of bootstrapped switch S1, thus turning off bootstrapped switch S1.

Figure 8:
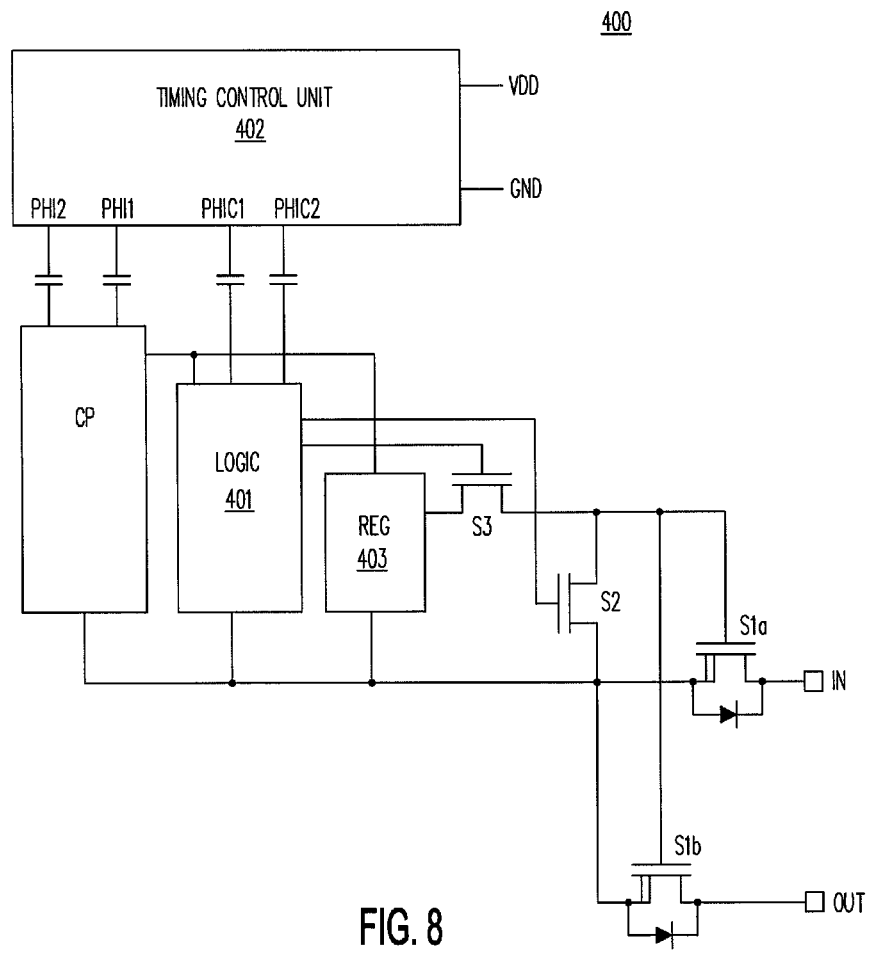
FIG. 8 is a block diagram 400 illustrating a bootstrapped switch circuit that is capable of bipolar operations, according to one embodiment of the present invention.

FIG. 8 is a block diagram 400 illustrating a bootstrapped switch circuit that is capable of bipolar operations, according to one embodiment of the present invention. As shown in FIG. 8, the bootstrapped switch circuit of block diagram 400 achieves bipolar operation by implementing bootstrapped switch S1 as two NMOS transistors S1a and S1b that are connected source-to-source. In this configuration, the parasitic diodes of NMOS transistors S1a and S1b cannot be rendered conductive simultaneously. Thus, input terminal IN may be much higher or lower in potential as output terminal OUT, without turning on both parasitic diodes. Unlike charge pump NMOS CP, NMOS logic circuit 301, NMOS regulator circuit 303 of FIG. 7(a), charge pump CP, logic circuit 401 and regulator circuit 403 need not be implemented only by NMOS transistors. In FIG. 8, charge pump CP is connected to the source terminal common to both NMOS switches S1a and S1b.

Figure 9:
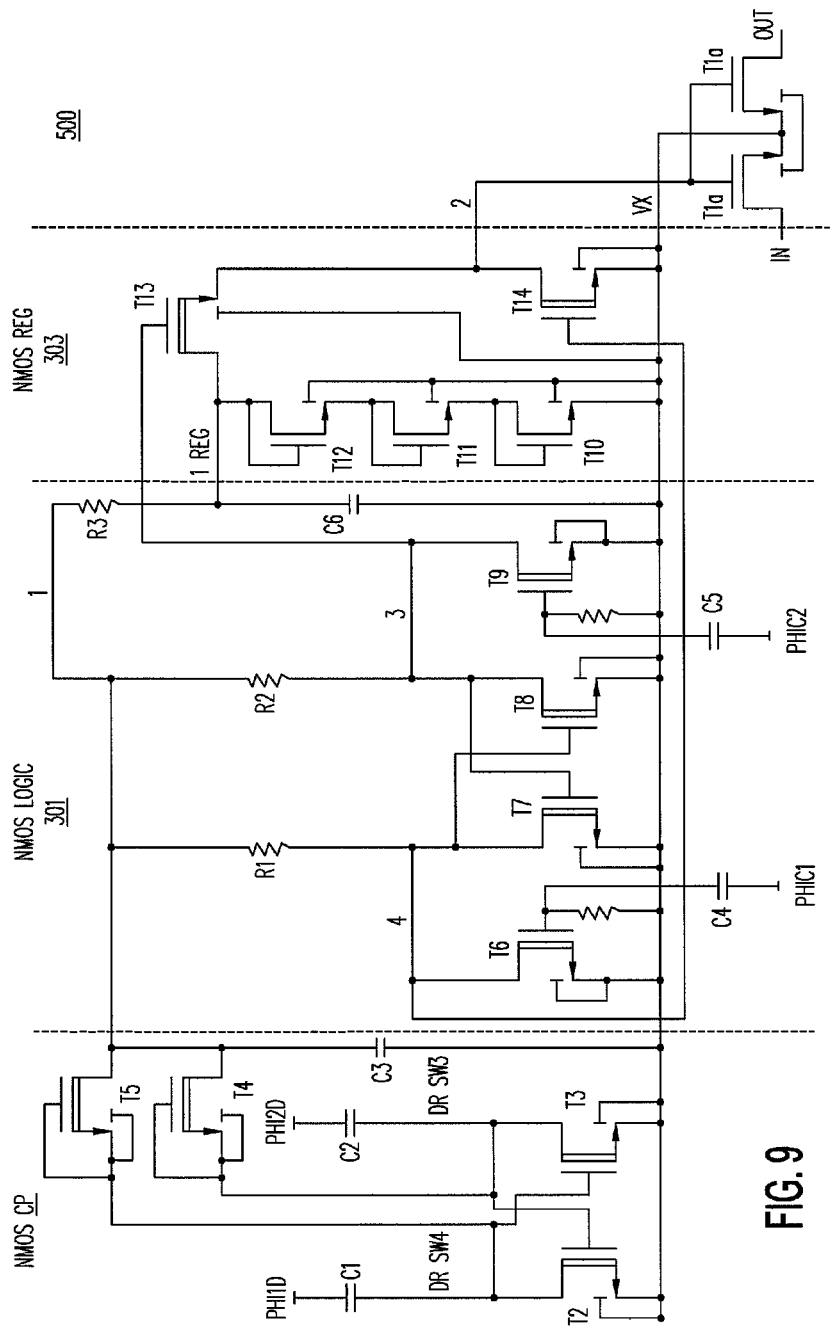
FIG. 9 shows schematic circuit 500 which implements the bootstrapped switch circuit of block diagram 300 of FIG. 7(a), in accordance with one embodiment of the present invention.

FIG. 9 shows schematic circuit 500 which implements the bootstrapped switch circuit of block diagram 300 of FIG. 7(a), in accordance with one embodiment of the present invention. As shown in FIG. 9, bootstrapped switch circuit 500 does not include a PMOS transistor. Charge pump NMOS CP is implemented by NMOS transistors T2, T3, T4 and T5 and capacitor C1, C2 and C3 in substantially the same manner as FIG. 6's charge pump CP is implemented in bootstrapped switch circuit 200. Charge pump NMOS CP provides a voltage across capacitor C3. NMOS logic circuit 301 is implemented by a latch structure that includes NMOS transistors T6, T7, T8 and T9, resistors R1 and R2. NMOS transistors T6 and T9 are turned on through the voltages on capacitors C4 and C5, which are provided from signal level transitions in clock signals PHIC1 and PHIC2, respectively, resulting in the stored values at electrical nodes 4 and 3 being overwritten. Resistor R3, NMOS transistors T10, T11, and T12 and capacitor C6 form NMOS regulator circuit 303, which maintains electrical node 1_REG at three MOS diode drops higher than electrical node VX. When electrical node 3 goes high (relative to electrical node VX) and the voltage at electrode node 1 exceeds drain terminal 1_REG of NMOS transistor T13 by at least one threshold voltage, NMOS transistor T13 becomes conducting, thereby connecting electrical node 1_REG to electrical node 2. When NMOS transistor T14 is conducting (i.e., electrode node 4 is high relative to electrical node VX), the gate-to-source capacitances of NMOS transistors T1a and T1b are discharged, opening the connection between input terminal IN from output terminal OUT of bootstrapped switch S1.

Figure 10:
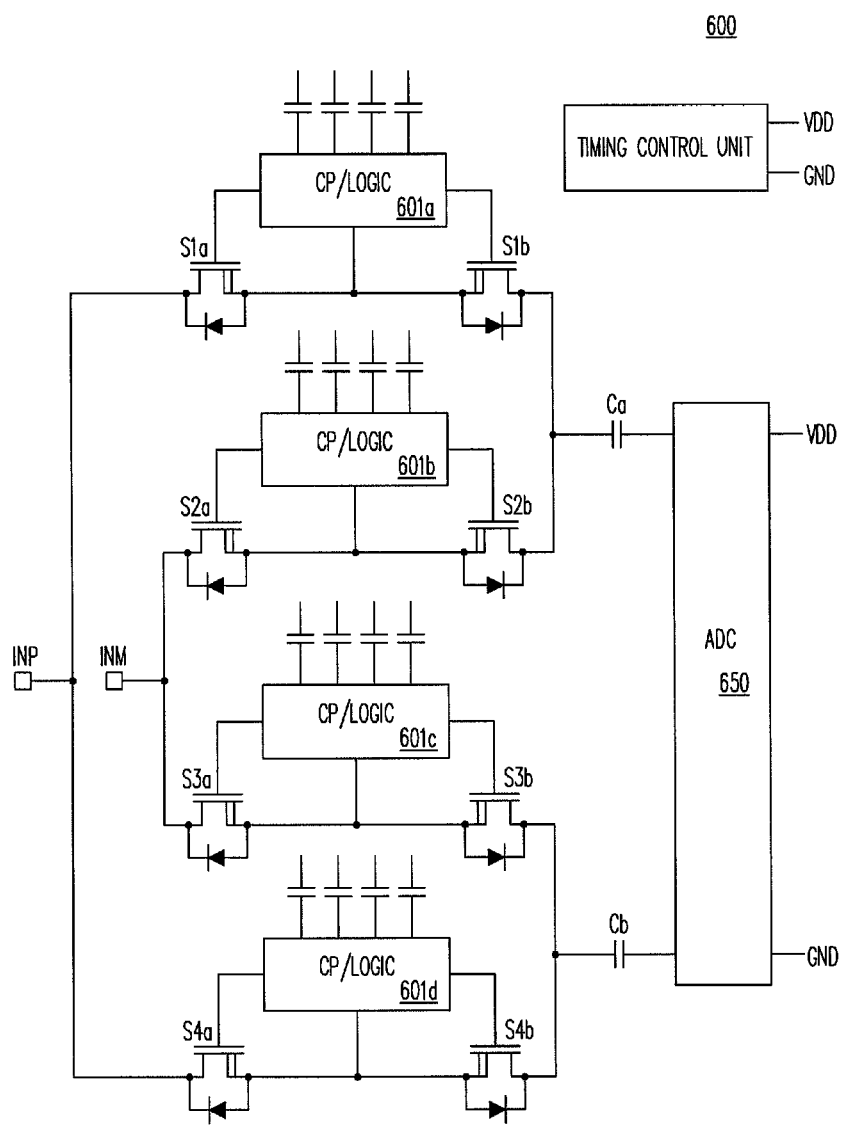
FIG. 10 shows input sampling network 600 for fully differential isolated ADC 650, in accordance with one embodiment of the present invention.

FIG. 10 shows input sampling network 600 for fully differential isolated ADC 650, in accordance with one embodiment of the present invention. As shown in FIG. 10, input sampling network 600 includes bootstrapped switches 601a, 601b, 601c and 601d, each of which may be implemented by any bootstrapped switch circuit of the present invention, such as bootstrapped switch circuit 500 of FIG. 9. In FIG. 10, the bootstrapped switches are capacitively coupled to ADC 650, but they can also alternatively be resistively coupled to ADC 650. Input sampling network 600 can accurately sample positive and negative input voltages over an extended common mode range. According to one implementation, an input sampling circuit of the present invention (e.g., input sampling network 600) designed to a 0.6 BICMOS process may sample signals in a common mode range between −36V and +36V without requiring a negative supply voltage. For example, such a sampling network may sample large differential signals (e.g. ±6V, $V_{DSMAX}$) at a common mode voltage from −33V up to +33 to an ADC supplied between GND and 5V.

The above detailed description is provided to illustrate the specific embodiments of the present invention and is not limiting. Numerous variations and modifications within the scope of the present invention are possible. The present invention is set forth in the accompanying claims.

I claim:

1. A bootstrapped switch circuit coupled to a timing circuit that provides one or more clock signals, and having an input terminal and an output terminal, comprising:
   a switch having a first terminal coupled to the input terminal, a second terminal coupled to the output terminal, and a control terminal;
   a charge pump, including a storage capacitor connected to either the first terminal or the second terminal of the switch and one or more capacitors coupled to the clock signals, wherein the charge pump is isolated from the timing circuit via the one or more capacitors of the charge pump and wherein the charge pump generates an output voltage across the storage capacitor; and
   a logic circuit, including one or more capacitors coupled to the clock signals, wherein the logic circuit is isolated from the timing control circuit via the one or more capacitors of the logic circuit and wherein the logic circuit provides a control signal to the control terminal of the switch that is derived from the output voltage across the storage capacitor.

2. The bootstrapped switch circuit of claim 1, wherein the switch comprises a transistor providing a source terminal as the first terminal of the switch, a drain terminal as the second terminal of the switch and a gate terminal as the control terminal of the switch.

3. The bootstrapped switch circuit of claim 1, wherein the switch comprises two transistors having their source terminals connected in common.

4. The bootstrapped switch circuit of claim 3, wherein the one or more capacitors of the logic circuit are each connected to the source terminals in common by a resistor.

5. The bootstrapped switch circuit of claim 1, wherein the logic circuit further comprises a voltage regulator circuit that generates a regulated voltage from the output voltage of across the storage capacitor.

6. The bootstrapped switch circuit of claim 5, wherein the voltage regulator circuit comprises series-connected diodes.

7. The bootstrapped switch circuit of claim 1, wherein the logic circuit comprises a latch structure.

8. The boot strapped switch circuit of claim 1, wherein the charge pump, the logic circuit and the switch are implemented by NMOS transistors.

9. The bootstrapped switch circuit of claim 8, wherein the NMOS transistors are formed in a P-well enclosed by a N-tub region in a semiconductor substrate.

10. The bootstrapped switch circuit of claim 9, wherein the N-tub region is actively biased between a reference voltage and input signal.

11. The bootstrapped switch circuit of claim 9, wherein the N-tub region is floating.

12. The bootstrapped switch circuit of claim 1, wherein the clock signals comprise one or more pairs of complementary, but non-overlapping periodical waveforms.

13. An input sampling network receiving a differential signal across a first analog input terminal and a second analog input terminal, comprising:
   an analog to digital converter having a first input terminal and a second input terminal;
   a first and second bootstrapped switch circuits each selectably coupling the first analog input terminal of the input sampling network to the first input terminal of the analog-to-digital converter; and
   third and fourth bootstrapped switch circuits each selectably coupling the second analog input terminal of the input sampling network to the second input terminal of the analog-to-digital converter, wherein one or more of the first, second, third and fourth bootstrapped switch circuits (i) are coupled to a timing circuit that provides one or more clock signals, (ii) each have an input terminal and an output terminal, and (iii) each comprise:
      a switch having a first terminal coupled to the input terminal of the input terminal of the corresponding bootstrapped switch circuit, a second terminal coupled to the output terminal of the corresponding bootstrapped switch circuit, and a control terminal;
      a charge pump coupled to the clock signals and isolated from the timing circuit via a first capacitor and a second capacitor, the charge pump generating an output voltage; and
      a logic circuit coupled to the clock signals and isolated from the timing control circuit via a third capacitor and a fourth capacitor, wherein the logic circuit provides a control signal to the control terminal of the switch that is derived from the output voltage of the charge pump.

14. The input sampling network of claim 13, wherein the first input terminal of the analog-to-digital converter is capacitively coupled to the first and second bootstrapped switch circuits.

15. The input sampling network of claim 13, wherein the second input terminal of the analog-to-digital converter is capacitively coupled to the third and fourth bootstrapped switch circuits.

16. The input sampling network of claim 13, wherein the first input terminal of the analog-to-digital converter is resistively coupled to the first and second bootstrapped switch circuits.

17. The input sampling network of claim 13, wherein the second input terminal of the analog-to-digital converter is resistively coupled to the third and fourth bootstrapped switch circuits.

18. The input sampling network of claim 13, wherein the switch of the corresponding bootstrapped switch circuit comprises a transistor providing a source terminal as the first terminal of the switch, a drain terminal as the second terminal of the switch and a gate terminal as the control terminal of the switch.

19. The input sampling network of claim 13, wherein the switch of the corresponding bootstrapped circuit comprises two transistors having their source terminals connected in common.

20. The input sampling network of claim 19, wherein the third capacitor and the fourth capacitor are each connected to the source terminal by a resistor.

21. The input sampling network of claim 13, wherein the logic circuit further comprises a voltage regulator circuit that generates a regulated voltage from the output voltage of the charge pump.

22. The input sampling network of claim 21, wherein the voltage regulator circuit comprises series-connected diodes.

23. The input sampling network of claim 13, wherein the logic circuit comprises a latch structure.

24. The input sampling network of claim 13, wherein the charge pump, the logic circuit and the switch are implemented by NMOS transistors.

25. The input sampling network of claim 24, wherein the NMOS transistors are formed in a P-well enclosed by a N-tub region in a semiconductor substrate.

26. The input sampling network of claim 25, wherein the N-tub region is actively biased between a reference voltage and input signal.

27. The input sampling network of claim 25, wherein the N-tub region is floating.

28. The input sampling network of claim 13, wherein the clock signals comprise one or more pairs of complementary, but non-overlapping periodical waveforms.

* * * * *